United States Patent [19]

Ukai et al.

[11] Patent Number: 5,710,598
[45] Date of Patent: Jan. 20, 1998

[54] PICTURE COMPRESSING AND EXPANDING APPARATUS

[75] Inventors: Yukihiro Ukai; Takashi Tsuchitani, both of Suita, Japan

[73] Assignee: Mega Chips Corporation, Suita, Japan

[21] Appl. No.: 534,032

[22] Filed: Sep. 26, 1995

[30] Foreign Application Priority Data

Sep. 28, 1994 [JP] Japan .................................. 6-233094

[51] Int. Cl.$^6$ ...................................................... H04N 7/30
[52] U.S. Cl. .......................... 348/408; 348/411; 348/412; 348/413; 348/416
[58] Field of Search .................... 348/408, 411, 348/412, 413, 416; H04N 7/30

[56] References Cited

U.S. PATENT DOCUMENTS 5,068,727  11/1991  Haghiri ........................... 348/412
5,510,842   4/1996  Phillips ........................... 348/416
5,532,744   7/1996  Akiwumi-Assani ............. 348/390

*Primary Examiner*—Howard W. Britton
*Attorney, Agent, or Firm*—Oblon, Spivak, McClelland, Maier & Neustadt, P.C.

[57] ABSTRACT

A decoding speed is improved. A processing method is changed in variable length decoders depending on whether only one piece of data is to be decoded or two or more pieces of data are to be decoded, thereby suppressing an increase in the size of hardware as much as possible and increasing a processing speed. Although irregular data are created in the first cycle when a large scale decoder having a slow processing speed processes data, a delay apparatus delays data which include the irregular data and data which are supplied from the large scale decoder without a delay are filled in the irregular data portion. As a result, the irregular portion of the data is compensated for and a relative delay of the processing is prevented.

5 Claims, 10 Drawing Sheets

FIG. 2A
CK

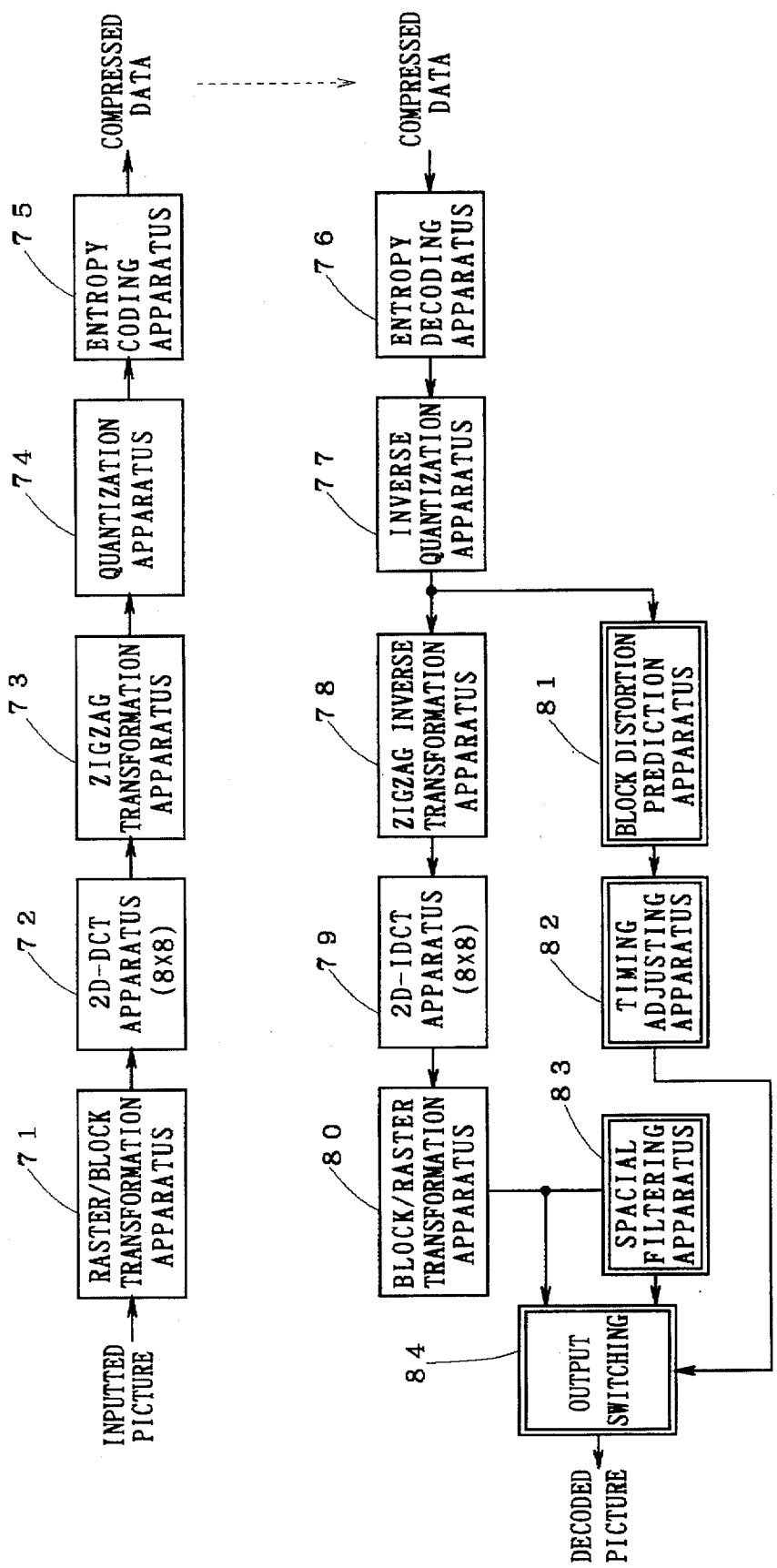

PICTURE COMPRESSING AND EXPANDING APPARATUS

BACKGROUND OF THE INVENTION

1. Field of the Invention

The present invention is related to a picture compressing and expanding apparatus for compressing a picture signal and expanding compressed data.

2. Description of the Background Art

<<Example of Huffman Decoder>>

In general, since a data length of a variable length code is variable, it is impossible to decode encoded data by a method other than a sequential decoding method. That is, parallel decoding processing is difficult, and therefore, a high speed decoder for decoding a variable length code is strongly desired. A typical variable coding method is a Huffman coding method. In Huffman coding, a variable length code is assigned depending on an appearance frequency of data. When Huffman coding is used to handle picture data in particular, since pieces of data having the same values are likely to continue, a run length of such data values is decided as an object of encoding and a plurality of pieces of data are encoded at a time.

FIG. 7 shows an example of a structure of a high speed Huffman decoder utilizing a conventional run length. In FIG. 7, denoted at 1 is an input data control block for outputting a piece of data of variable length data which is to be processed next, denoted at 2 is a decoding data table (look-up table) in which data needed to decode Huffman codes are written, denoted at 3 is a decoded data quantity calculating block for calculating the quantity of decoded data based on the contents of the decoding data table 2 and for generating a timing signal used for decoding, denoted at 4 is a run length counter for detecting a run length in which data having the same values continue, and denoted at 5 and 6 are delay circuits (delay).

To decode Huffman codes at a high speed, the decoding data table 2 has the following data structure which is formed by an associative memory or a regular memory. That is, variable length data includes redundant data and the same data values are written in corresponding addresses. For instance, a Huffman code consisting of maximum eight bits includes two Huffman code bits and the same decoding data values are written in all possible addresses of the remaining six bits.

Using such a table structure, decoding is achieved by looking up the table only once.

<<Example of Conventional ADCT>>

In general, non-reversible coding is a compression method to achieve a high compression rate by efficiently quantizing data utilizing human sense. A popular compression method is orthogonal transformation. Orthogonal transformation is to transform a spacial axis in such a manner that electric power of signals concentrates. Two-dimensional discrete cosine transformation (hereinafter "2D-DCT"), one of space frequency/space transformation methods, is often used to handle picture data, considering a transformation efficiency and the size of hardware.

A typical compression method for handling picture utilizing 2D-DCT is adaptive discrete cosine transformation (ADCT). This compression method is adopted for JPEG and MPEG, i.e., international standards regarding picture compression. In this method, however, a block-shaped distortion unique to orthogonal transformation (hereinafter "block distortion") is created as a compression rate is increased. A block distortion is conspicuous in a picture portion with a relatively moderate graduation such as a sky and a wall. Human eyes sense a block distortion as a large deterioration in the picture quality.

FIG. 8 shows a compression/expansion flow in ADCT which solves the common problem of a block distortion. In FIG. 8, denoted at 11 to 15 are apparatuses which are used for encoding. The raster/block transformation apparatus 11 transforms raster data into 8×8 block data which are to be supplied to a 2D-DCT apparatus. The two-dimensional discrete cosine transformation apparatus 12 (2D-DCT apparatus) performs space/frequency space transformation. The zigzag transformation apparatus 13 scans results of DCT in an order from low frequencies, sorts data and outputs the data. The quantization apparatus 14 performs scalar transformation. The entropy coding apparatus 15 performs Huffman coding, arithmetic coding, etc. Denoted at 16 to 21 in FIG. 8 are apparatuses which perform inverse transformation to reverse the encoding operations above. Denoted at 16 is an entropy decoding apparatus and denoted at 17 is an inverse quantization apparatus. The zigzag inverse transformation apparatus 18 sorts one-dimensional data into a zigzag arrangement to obtain a two-dimensional arrangement of the data. The two-dimensional discrete inverse cosine transformation apparatus 19 (2D-IDCT apparatus) performs frequency space/space transformation. The block/raster transformation apparatus 20 transforms 8×8 block data into raster data. The spacial filtering apparatus 21 is used to reduce a block distortion of a decoded picture by blurring the picture.

Next, an operation of a conventional picture compressing and expanding apparatus will be described. During encoding, the raster/block transformation apparatus 11 transforms picture data which are in the form of raster data into 8×8 block data. The 2D-DCT apparatus 12 transforms the transformed block data by space/frequency space transformation. The data transformed into a frequency space are sorted in an order from low frequencies and outputted by the zigzag transformation apparatus 13. Utilizing human visual characteristics, the quantization apparatus 14 finely quantizes low frequency data and roughly quantizes high frequency data, whereby electric power concentration of the data is intensified while suppressing a deterioration in the picture quality and therefore a compression rate is improved. The entropy coding apparatus 15 compresses the data by entropy coding such as Huffman coding.

On the other hand, a decoding process is realized by performing inverse transformation which reverses the encoding operations above. After processed by the spacial filtering apparatus 21 to reduce a block distortion, the decoded data transformed into raster data are outputted.

In a method of dealing with a block distortion used for such a conventional picture compressing and expanding apparatus, data of successive blocks are slightly overlapped each other and processed by the 2D-DCT apparatus and the 2D-IDCT apparatus of FIG. 8, whereby the discontinuity of spacial filter frequencies at overlapping portions are reduced.

<<Example of Conventional Picture Compressing and Expanding Apparatus and Peripheral Apparatus>>

In general, a video signal for generating a picture is formed basically by two types of synchronizing signals, i.e., a vertical synchronizing signal (hereinafter "VSYNC") and a horizontal synchronizing signal (hereinafter "HSYNC"). Normally, a video signal includes invalid data in both a vertical direction and a horizontal direction. For example, with respect to an NTSC signal, valid data are about 480 lines out of 525 lines. In the horizontal direction, about 80% of a scanning area is a valid area. During compression of a picture signal, in general, the valid data alone are compressed so as to reduce the quantity of data to be processed and to increase a processing speed. FIG. 9 shows an example of a structure of a conventional picture compressing and expanding apparatus (First conventional technique). In FIG. 9, denoted at 31 is a timing generation apparatus for generating a timing signal which defines the timing of inputting valid picture data into and outputting the valid picture data from a frame buffer based on the signals HSYNC and VSYNC. The frame buffer 32 of about 6 mega bits temporarily buffers the valid picture data. A compression and expansion apparatus 33 compresses and expands picture data. A compression data memory apparatus 34 stores compressed data. Denoted at 35a, 35b, 35c, 36a, 36b and 36c in FIG. 9 are elements which form an internal portion of the compression and expansion apparatus 33. The delay apparatuses (delays) 35a, 35b, and 35c delay pipeline processing. The signal processing apparatuses 35a, 35b, 35c, 36a, 36b and 36c are disposed for the respective pipelines.

Now, a sequence of processing will be described. First, during a compression mode, the timing generation apparatus 31 ensures that the frame buffer 32 receives only a valid portion of a picture which is expressed by a digital video signal which is inputted to the picture compressing and expanding apparatus. The compression and expansion apparatus 33 sequentially compresses data of the valid portion out of the data which are supplied to the frame buffer 32. Compressed data are accumulated in the compression data memory apparatus 34. On the other hand, during an expansion mode, the compressed data are temporarily retained in the frame buffer 32 and outputted at timing for valid data created by the timing generation apparatus 31 using the signals HSYNC and VSYNC.

FIG. 10 shows an example of a structure of a conventional picture compressing and expanding apparatus using other method (Second conventional technique). In FIG. 10, apparatuses 41 and 42 are similar to the compression and expansion apparatus 33 and the compression data memory apparatus 34 of FIG. 9, respectively. An FIFO memory 43 temporarily buffers data. An input/output control apparatus 44 generates input/output timing for inputting data into or outputting data from the FIFO memory 43 in accordance with the signals HSYNC and VSYNC. An FIFO control apparatus 45 controls the FIFO memory 43.

Now, an operation will be described. During compression, in accordance with the timing signal generated by the input/output control apparatus 44, data are inputted to the FIFO. The data are compressed while the FIFO control apparatus 45 stops a clock into the compression and expansion apparatus 41 or controls other operations so that the FIFO memory 43 does not become FULL or NULL. During expansion, data are decoded until the FIFO memory 43 becomes full to a certain extent, and the compression and expansion apparatus 41 is stopped operating by cutting supply of a clock into the compression and expansion apparatus 41 or by other operation. The data are outputted from the FIFO memory 43 in accordance with a signal from the input/output control apparatus 44, or the compression and expansion apparatus 41 is allowed to operate again after the data in the FIFO memory 43 decrease to a certain extent. Thus, during expansion as well, the processing is performed under the control of the FIFO control apparatus 45 so that the FIFO memory 43 does not become FULL or NULL.

<<Problem with Conventional Huffman Decoder>>

A conventional high speed Huffman decoder as that shown in FIG. 7 uses a ROM, a RAM or an associative memory as tables. This is because the size of the hardware becomes unpractically large if all tables are formed by hardware decoders.

Since a speed of reading data from the memories which are used as the tables is slower than processing speeds at the other blocks, the reading speed of reading from the decoding data table 2 is an influential factor which determines the processing speed of the variable length coding and decoding apparatus.

<<Problem with Conventional ADCT>>

As described earlier, in the conventional ADCT method of FIG. 8, a block distortion is reduced by processing data while inserting the spacial filtering apparatus 21 in a decoded output or while slightly overlapping data of adjacent blocks in the 2D-DCT apparatus 12 and the 2D-IDCT apparatus 19.

However, in the method using the spacial filtering apparatus 21, since all pictures are filtered, even a fine portion of a picture where a block distortion is not noticeable is blurred, and therefore, it is impossible to improve the total picture quality. Meanwhile, in the method of performing DCT processing with data overlapped each other, it is very difficult to process a picture signal on a real time basis since the quantity of data to be processed is large.

<<Problem with Conventional Picture Compressing and Expanding Apparatus>>

In a conventional picture compressing and expanding apparatus for handling a picture signal (First and second conventional techniques), the input/output timing for the frame buffer 32 of FIG. 9 or the FIFO memory 43 of FIG. 10 is controlled and the input/output timing of handling a picture signal is controlled, so that it is possible to handle a valid period of the picture signal.

However, the frame buffer 32 of FIG. 9 (First conventional technique) must include a memory having a large capacity (about 6 mega bytes) to store one picture. Further, since inputting and outputting must be performed asynchronously, inputting and outputting of a digital video signal are realized using a dual port structure in most cases (e.g., VRAM). This costs relatively much and accounts for a substantially large portion of the cost for manufacturing the compression and expansion apparatus.

Further, in controlling the input/output timing of handling data by controlling the FIFO memory 43 of FIG. 10 (Second conventional technique), whether the FIFO memory 43 is filled (FULL) is detected, and the compression and expansion apparatus 41 is stopped operating when the FIFO memory 43 becomes filled. Whether the FIFO memory 43 becomes vacant (NULL) is also detected, and the compression and expansion apparatus 41 is controlled to speed up the operation when the FIFO memory 43 becomes vacant. Thus, the FIFO control apparatus 45 must perform rather complex operations to ensure that the FIFO memory 43 does not become FULL or NULL. In addition, when data to be expanded need be switched during expansion, it is necessary to synchronize the switching timing to store the data to the compression data memory apparatus 34 to the control operation performed by the FIFO control apparatus 45 as above depending on the condition of the FIFO memory 43, extremely fine and complex control operations are necessary to control the operations of the compression and expansion apparatus 41.

SUMMARY OF THE INVENTION

A first aspect of the present invention is related to a picture compressing and expanding comprising a compression part for compressing a picture signal and an expansion part for decoding and expanding data of variable length codes compressed by the compression part, the expansion part being characterized in comprising: a small scale decoder for decoding one piece of compressed data; a large scale decoder having a processing speed which is approximately half that of the small scale decoder and decodes two or more pieces of the compressed data; input data control means for supplying one piece of data or two or more pieces of data to the small scale decoder and the large scale decoder at the same time; first switching means for switching and outputting output data supplied from the small scale decoder and output data supplied from the large scale decoder; delaying means for delaying output data supplied from the first switching means by a unit time; second switching means for switching and outputting the output data supplied from the first switching means and output data supplied from the delaying means in accordance with a predetermined timing signal; and timing control means for generating the predetermined timing signal which causes the second switching means to switch from the output data supplied from the delaying means to the output data supplied from the first switching means.

The small scale decoder comprises judging means for determining whether received data are one piece of data or two or more pieces of data, and the timing control means comprises: irregular timing detecting means for detecting irregular data which are created when the first switching means switches the output data supplied from the small scale decoder and the output data supplied from the large scale decoder in accordance with a judgement signal which is yielded by the judging means for the small scale decoder; and timing signal output means for the predetermined timing signal to the second switching means in accordance with a signal received from the timing control means.

A picture compressing and expanding apparatus according to a second aspect of the present invention comprises: a compression part for transforming a picture signal by orthogonal transformation to thereby non-reversibly compress the picture signal; an expansion part for decoding and expanding the data which are compressed by the compression part and for outputting the data; a filter part for filtering at least a portion of the data which are outputted from the expansion part by a predetermined smooth filtering and for outputting the data; an output switching part for switching the data outputted from the expansion part and data outputted from the filter part; and a switching control part for controlling switching performed by the output switching part.

The output switching part comprises: block distortion predicting means for predicting a block distortion of the data outputted from the expansion part using a threshold which is determined in accordance with a data structure of a predetermined frequency space which is stored within the expansion part; and timing signal generating means for generating the predetermined timing signal which causes the output switching part to switch from the data outputted from the expansion part to the data outputted from the filter part in accordance with a prediction result yielded by the block distortion predicting means only when a block distortion is predicted.

According to a third aspect of the present invention, the block distortion predicting means of the switching control part comprises judging means for determining whether components not belonging to a predetermined low frequency region of data transformed into the frequency space through predetermined two-dimensional transformation are all "0."

A fourth aspect of the present invention is related to a picture compressing and expanding apparatus comprising a compression part for compressing a picture signal and an expansion part for decoding and expanding data of variable length codes compressed by the compression part so that the picture signal is processed through predetermined processing in pipelines in at least one of the compression part and the expansion part, the picture compressing and expanding apparatus being characterized in comprising: enable means for detecting timing at which pipelines validly operate in accordance with a horizontal synchronizing signal and a vertical synchronizing signal which are inputted to the enable means and for thereafter outputting a predetermined enable signal; and processing control means for permitting signal processing within the pipelines only when the predetermined enable signal is received from the enable means and for stopping signal processing within the pipelines when the predetermined enable signal is not received.

A fifth aspect of the present invention is related to a picture compressing and expanding apparatus comprising a compression part for compressing a picture signal and an expansion part for decoding and expanding data of variable length codes compressed by the compression part so that the picture signal is processed through predetermined processing in pipelines in at least one of the compression part and the expansion part, the expansion part being characterized in comprising: enable means for detecting timing at which pipelines validly operate in accordance with a horizontal synchronizing signal and a vertical synchronizing signal which are inputted to the enable means and for thereafter outputting a predetermined enable signal; enable signal delaying means for delaying the predetermined enable signal by the number of the pipelines which perform signal processing; and processing control means for permitting signal processing within each one of the pipelines only when the predetermined enable signal corresponding to each one of the pipelines is received from the enable means or the enable signal delaying means and for stopping signal processing within the pipelines when the predetermined enable signal is not received.

The first aspect of the present invention uses the small scale decoder and the large scale decoder. The timing of the irregular data which are created during processing by the large scale decoder which has a slow processing speed is detected and the predetermined timing signal is outputted to the second switching means at the same time, so that the data outputted from the first switching means without a delay are filled in at the irregular timing which is delayed by the delaying means. The small scale decoder having a fast processing speed decodes data when only one piece of data is to be decoded, thereby outputting data at a high speed. When two or more pieces of data are to be decoded, on the other hand, the large scale decoder decodes the data and the data outputted from the first switching means without a delay is filled in at the irregular timing which is delayed by the delaying means, whereby a data stream eventually outputted is corrected and damage to the data due to the slow processing speed of the large scale decoder is prevented. This improves a processing speed of the picture compressing and expanding apparatus as a whole. The processing speed during decoding and expanding of variable length codes is nearly twice faster than that of a conventional apparatus. Real time processing of a video signal heretofore impossible is possible.

According to the second aspect of the present invention, a picture having a complex pattern is prevented from getting blurred and a block distortion is reduced since only a portion which is likely to have a block distortion is smoothed. Hence, a picture with a suppressed visual deterioration is obtained even when a compression rate is increased. Only filtering is performed appropriately on decoded data, and therefore, the quantity of data to be processed does not increase unlike where data of adjacent blocks are overlapped each other and DCT processing is performed on such data. This reduces a processing time than in a conventional apparatus.

According to the third aspect of the present invention, a block distortion of the data outputted from the expansion part is predicted only by judging whether all components not belonging to the predetermined low frequency region of the data transformed into the frequency space through predetermined two-dimensional transformation are all "0." Hence, control of the switching operation by the output switching part does not need a very long time, thereby improving the processing efficiency.

According to the fourth aspect of the present invention, during both compression and expansion, the enable means detects the timing at which the respective pipelines validly operate in accordance with the horizontal synchronizing signal and the vertical synchronizing signal and outputs the predetermined enable signal. The processing control means permits signal processing within the pipelines only when the predetermined enable signal is received from the enable means and stops signal processing within the pipelines when the predetermined enable signal is not received. Hence, only a portion with a valid video signal is inputted and outputted in synchronization with a signal HSYNC and a signal VSYNC. This allows the picture compressing and expanding apparatus to handle a video signal without using a frame buffer or an FIFO, thereby reducing a cost to manufacture the picture compressing and expanding apparatus. Further, since a valid period and an invalid period are clearly distinguished from each other during inputting and outputting of a signal, data are controlled in a very simple manner and it is easy to switch compressed data during expansion.

According to the fifth aspect of the present invention, while the enable signal delaying means adjusts the timing by delaying the predetermined enable signal by the number of the pipelines which perform signal processing, the processing control means permits signal processing within the pipelines only when the predetermined enable signal is received and stops signal processing within the pipelines when the predetermined enable signal is not received. Since processing in each pipeline is allowed only during a period in which valid data should be processed in this manner, it is possible to easily input and output data of only a valid portion at appropriate timing which is suitable to each pipeline, and timing control is extremely easy.

Accordingly, an object of the present invention is to provide a picture compressing and expanding apparatus for handling variable length codes which perform highs speed processing because of an improved processing speed of a decoding data table.

Another object of the present invention is to provide a decoding apparatus which improves a decoded picture up to a certain level without causing visual deterioration even when a compression ratio is increased and which processes data in a short period of time.

Still another object of the present invention is to provide a picture compressing and expanding apparatus in which a picture image is inputted and outputted without using a frame buffer or an FIFO.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 2A–2J are a timing chart showing an operation of the picture compressing and expanding apparatus according to the first preferred embodiment of the present invention;

FIG. 3 shows a compression/expansion flow in a picture compressing and expanding apparatus using ADCT method according to a second preferred embodiment of the present invention;

DESCRIPTION OF THE PREFERRED EMBODIMENTS

<<First Preferred Embodiment>>
<Principle>

In general, picture data often include succession of pieces of data having the same value. Hence, differentials between adjacent data are "0" in many cases. In discrete cosine transformation (DCT) in particular, since data tend to concentrate in a particular region (e.g., a low frequency region), it is very likely that such differentials become "0." For example, if differentials are expressed as:

"0005"                                (1)

Huffman codes are assigned two-dimensionally so that a run length of "0" (hereinafter "0 run length") is "3" and followed by a value "5" (which is data other than "0"). Since the data "3" which are the 0 run length and the subsequent data "5" are decoded together, in the case of the sequence (1), four pieces of data are processed by one decoding.

"2134"                                (2)

On the other hand, in the case of the sequence (2) above wherein data other than "0" continue as differential data, i.e., the 0 run length is "0," data to be decoded are "2," "1," "3" and "4." Thus, only one piece of data can be processed by one decoding.

From the above, it is understood that the processing speed at least doubles depending on whether the 0 run length is "0." In short, when the 0 run length is "1" or larger, since two or more pieces of data are decoded at one time, even if looking up of the memory takes two cycles, final data are outputted at about the same timing as where final data are outputted after one decoding per one piece of data. Further, as described before, since succession of data other than "0" occurs in a particular limited region such as a low frequency region, to improve the processing speed, it is desirable to change processing depending on whether the 0 run length is "0." Considering this, whether the 0 run length is "0" or alternatively "1" or larger is detected first. A high speed hardware decoder processes a particular region with the 0 run length of "0" in a path which is different from a path for processing the 0 run length of "1." The picture compressing and expanding apparatus according to the present embodiment improves the processing speed using a decoder which operates at a higher speed than in the conventional techniques in which the processing speed of the apparatus depends on the speed of looking up of the memory.

<Structure>

Figure 1:
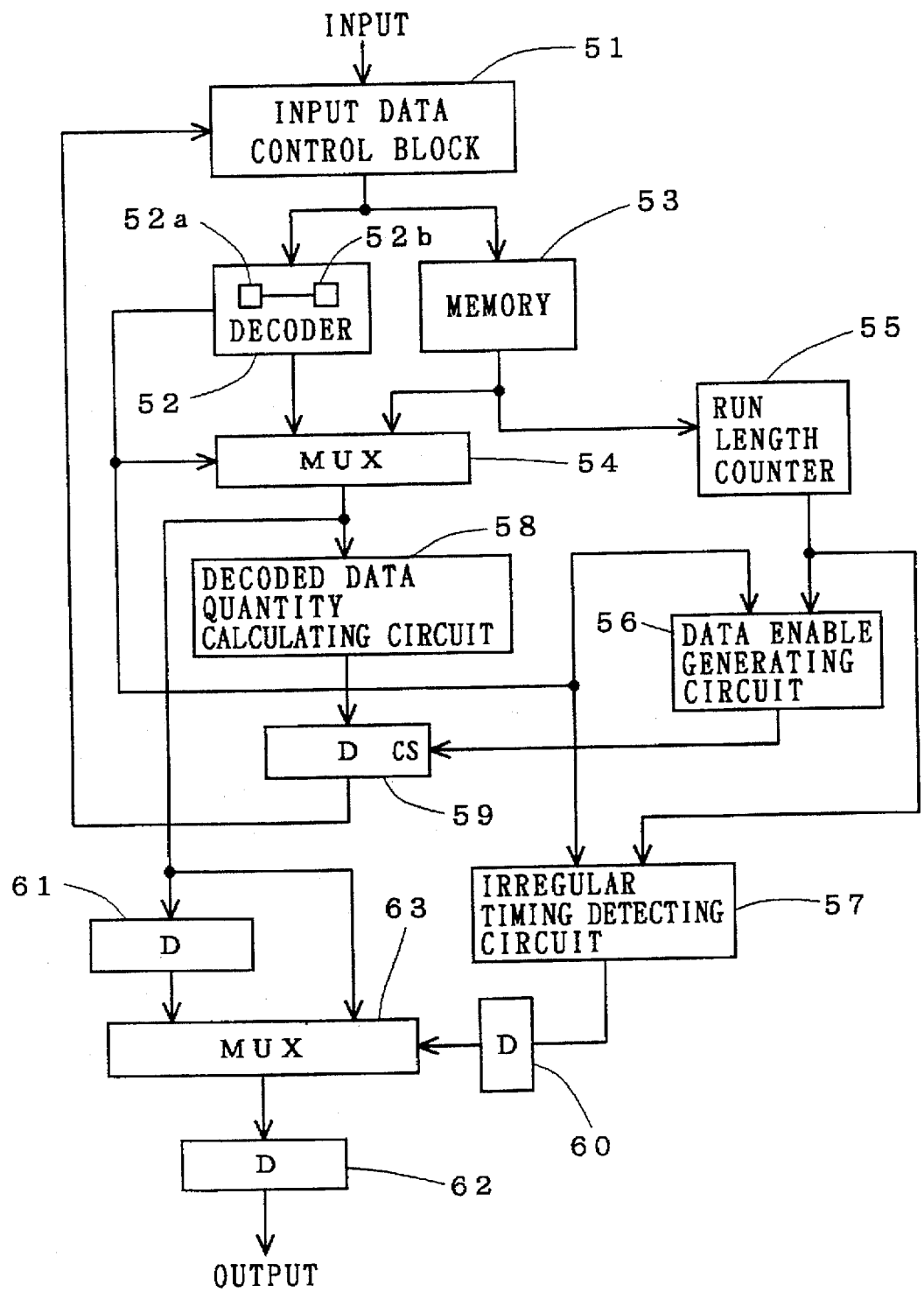
FIG. 1 is a view showing a structure of a Huffman decoder used in a picture compressing and expanding apparatus according to a first preferred embodiment of the present invention.
Figure 2B:
Figure 2C:
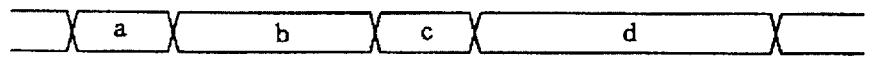

FIG. 1 is a view showing a structure of a decoding part of a picture compressing and expanding apparatus for decoding Huffman codes utilizing 0 run length data according to a first preferred embodiment of the present invention. The picture compressing and expanding apparatus according to the present embodiment comprises a compression part for compressing a picture signal and an expansion part for decoding and expanding data of variable length codes compressed by the compression part. In FIG. 1 showing the expansion part, denoted at 51 is an input data control block (input data control means) for determining data to be decoded next among the variable length data. A hardware decoder 52 performs high speed processing of decoding only Huffman codes which correspond to the 0 run length of "0" (small scale decoder: hereinafter "HW decoder"). An H/U signal (judgement signal) outputted from the HW decoder 52 expresses whether there was a hit in internal data of the HW decoder 52. More precisely, the HW decoder 52 outputs High signal when there was a hit in the internal data but outputs Low signal when there was not a hit in the internal data as shown in FIG. 2C. To perform such an operation, the HW decoder 52 comprises internal data storage means (memory) 52a for storing the internal data to be used as a reference and checking means (comparator: judging means) 52b for checking the internal data stored in the internal data storage means 52a with Huffman data supplied from the input data control block 51.

A memory (table: large scale decoder) 53 decodes Huffman codes with the 0 run length of "1" or larger. A first multiplexer (first switching means: hereinafter "first MUX") 54 selects decoded data supplied from the HW decoder 52 or decoded data supplied from the memory 53 in accordance with the H/U signal received from the HW decoder 52. A counter 55 counts the 0 run length to delay the timing of outputting data for the value of the 0 run length in accordance with the data of the 0 run length decoded by the memory 53. A data enable generating circuit 56 generates a flag which indicates whether to decode the next data in accordance with the H/U signal supplied from the decoder and an output from the 0 run length counter.

Figure 2D:
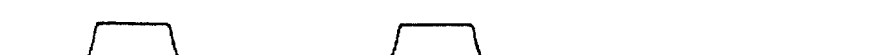
Figure 2E:
Figure 2F:
Figure 2G:
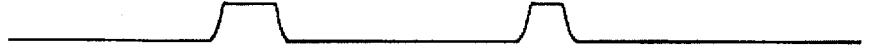
Figure 2H:
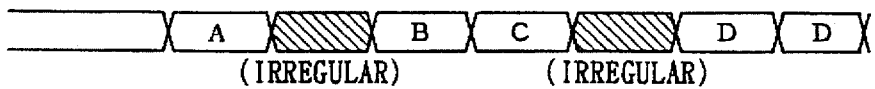
Figure 2I:
Figure 2J:
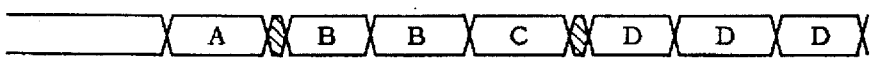

Further, when the Huffman data from the input data control block 51 do not have a hit in the internal data of the HW decoder 52, data are outputted at irregular timing since the speed of accessing the memory 53 is slow (See FIG. 2G). Hence, an irregular timing detecting circuit (irregular timing detecting means) 57 detects the irregular timing and generates a flag which controls the timing of outputting the data (See FIG. 2F).

A decoded data quantity calculating circuit 58 calculates the quantity of decoded data based on the data outputted form the first MUX 54 and generates auxiliary data which instructs outputting of compressed data which are to be decoded next. Delay apparatuses (delay) 59, 60, 61 and 62 delay a data stream by one cycle of a clock signal CK. A second multiplexer (second switching means: hereinafter "second MUX") 63 switches from output data supplied from the delay apparatus 61 (delaying means) to output data supplied from the first MUX 54 based on a timing signal from the delay apparatus 60 (timing signal outputting means).

The irregular timing detecting circuit 57 and the delay apparatus 60 form timing control means which generates a predetermined timing signal for switching the second MUX 63.

<Operation>

A sequence of processing in the picture compressing and expanding apparatus having such a structure as above will be described. FIGS. 2A–2J are a timing chart showing an operation of the picture compressing and expanding apparatus of the present embodiment. Data shown in FIG. 2B are outputted from the input data control block 51. It is assumed that the 0 run length of data a is "0," the 0 run length of data b is "1," the 0 run length of data c is "0" and the 0 run length data c is "2."

Outputted from the input data control block 51, the data a shown in FIG. 2B are supplied simultaneously to the HW decoder 52 and the memory 53 as shown in FIG. 1. The comparison means (comparator) within the HW decoder 52 detects whether the Huffman data a includes a hit in the internal data of the HW decoder 52. When the Huffman data a includes a hit in the internal data of the HW decoder 52, the comparison means outputs the H/U signal of High level (See FIG. 2C) as a flag which indicates the hit and also outputs decoded data (data A shown in FIG. 2D). On the other hand, when the 0 run length of data a is "1" or larger, the data a do not include a hit in the internal data of the HW decoder 52. Hence, the comparison means outputs the H/U signal of Low level (See FIG. 2C). The memory 53 always decodes the data a and outputs decoded data.

When informed by the HW decoder 52 of the hit, the first MUX 54 receives the H/U signal of High level and therefore selects the decoded data supplied from the HW decoder 52. On the other hand, when informed by the HW decoder 52 that there was not a hit, the first MUX 54 receives the H/U signal of Low level and therefore selects the decoded data supplied from the memory 53. The 0 run length data from the memory 53 are supplied to the 0 run length counter 55. The data enable generating circuit 56 postpones the timing of decoding the next data by the value of the 0 run length.

On the other hand, the decoded data quantity calculating circuit 58 calculates the quantity of decoded data based on the data outputted form the first MUX 54 and generates auxiliary data which instruct outputting of compressed data which are to be decoded next. The second MUX 63 fills in correct data at the timing detected by the irregular timing detecting circuit 57 (High signal shown in FIG. 2F) and generates final decoded data (data A shown 2I).

This is the processing performed on the data a shown in FIG. 2B. Since looking up of the memory 53 takes two cycles, the data shown in FIG. 2C are at Low level. Therefore, the subsequent cycle after the data a is outputted becomes irregular as shown between the data A and the data B. That is, the timing of decoding the data b shown FIG. 2B (data B shown in FIG. 2C) is two cycles after decoding of the data A. In other words, when the 0 run length of data a is "1" or larger, one irregular cycle is created.

To deal with this, the entire data stream is delayed by the delay apparatus (delay) 61 for one cycle. the data B (outputted from the first MUX 54: FIG. 2D) are filled in at such timing that the delayed irregular cycle portion (outputted from the delay apparatus 61: FIG. 2G) is not further delayed. As a result, the data stream related to the data B is outputted at the same speed as the cycle of the HW decoder 52.

When the 0 run length is "2" or larger as with the data d shown in FIG. 2B, data outputted from the delay apparatus 61 one cycle after the irregular timing detecting circuit 57 detects an irregular period shown in FIG. 2F (i.e., no hit in the HW decoder 52) become irregular as shown in FIG. 2G. Further, data D, data D continue as data following the irregular data shown in the section FIG. 2G. Hence, by filling in the data D in the irregular data portions by a similar operation to that performed for the data B, it is possible to output the data stream related to the data D at the same speed as the cycle of the HW decoder 52.

Thus, in the picture compressing and expanding apparatus of the present embodiment, although the HW decoder 52 must output decoded data within one clock after decoding codes having the 0 run length of "0," the memory 53 may output data within two cycles after decoding codes having the 0 run length of "1." Constructed to process Huffman codes with the 0 run length of "0" at a high speed, the HW decoder 52 has a small circuit size and performs very fast.

<<Second Preferred Embodiment>>
<Structure>

FIG. 3 is a functional block diagram showing a picture compressing and expanding apparatus according to a second preferred embodiment of the present invention. In FIG. 3, denoted at 71 to 75 are elements forming a compression part and denoted at 76 to 84 are elements forming an extension part. The raster/block transformation apparatus 71 transforms raster data into 8×8 block which are data to be supplied to the 2D-DCT apparatus. The two-dimensional discrete cosine transformation (2D-DCT) apparatus 72 performs space/frequency space transformation. The zigzag transformation apparatus 73 scans results of DCT in an order from low frequencies, sorts data and outputs the data. The quantization apparatus 74 performs scalar transformation. The entropy coding apparatus 75 performs Huffman coding, arithmetic coding, etc. Denoted at 76 is an entropy decoding apparatus and denoted at 77 is an inverse quantization apparatus. The zigzag inverse transformation apparatus 78 sorts one-dimensional data into a zigzag arrangement to obtain a two-dimensional arrangement of the data. The two-dimensional discrete inverse cosine transformation apparatus 79 (2D-IDCT apparatus) performs frequency space/space transformation. The block/raster transformation apparatus 80 transforms 8×8 block data into raster data. These apparatuses function similarly to their counterparts of the conventional apparatuses.

Figure 5:
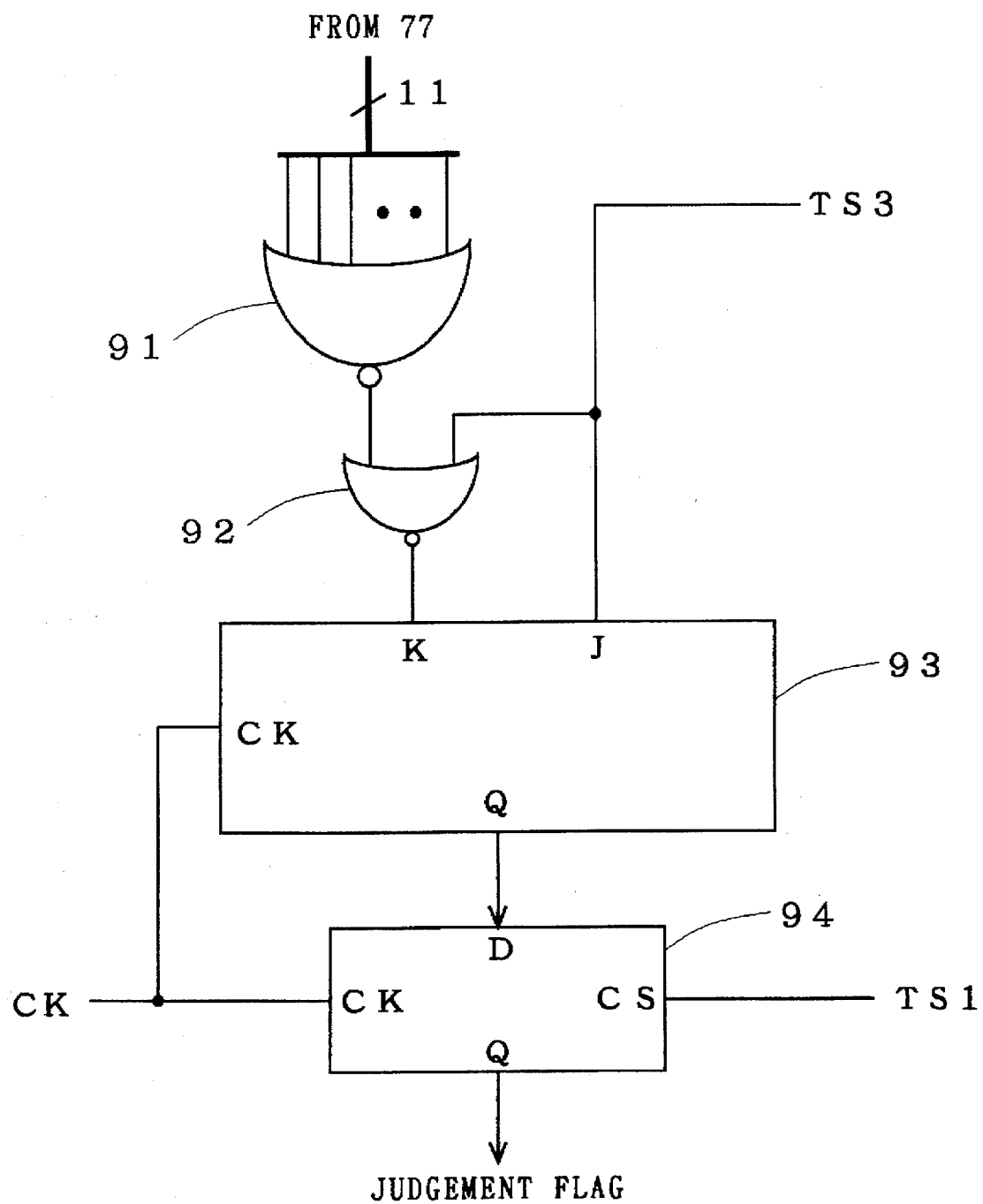
FIG. 5 is a view showing the picture compressing and expanding apparatus of a block distortion appearance judging circuit according to the second preferred embodiment of the present invention.

A block distortion prediction apparatus (block distortion predicting means) 81 detects a portion which is likely to have a block distortion out of the data structure of an inverse-quantized frequency space. The block distortion prediction apparatus 81 judges whether the fourth and subsequent data of data supplied from the inverse quantization apparatus 77 are all "0" (i.e., serves as judging means). FIG. 5 shows an inner structure of the block distortion prediction apparatus 81. In FIG. 5, during the first to the sixty-fourth timing of outputting data from the inverse quantization apparatus 77, a first timing signal TS3 becomes High from the first timing until the third timing and then changes to Low. Of the first through the sixty-fourth timing of outputting data from the inverse quantization apparatus 77, a second timing signal TS1 becomes High only during the first timing and then changes to Low. Denoted at CK is a clock signal. As shown in FIG. 5, the block distortion prediction apparatus 81 comprises a first NOR circuit 91 for yielding a logical sum (inversion) of 11 bits of an output signal from the inverse quantization apparatus 77, a second NOR circuit 92 for yielding a logical sum (inversion) of an output from the first NOR circuit 91 and the timing signal TS3, a J-K flip-flop 93 determining an output depending on combination of inputs supplied to two terminals J and K, and a D flip-flop 94 receiving the second timing signal TS1 as a set input signal (CS) and an output signal from the J-K flip-flop 93 as an input signal (D).

A timing adjusting apparatus (timing signal generating means) 82 adjusts the timing at which the block distortion prediction apparatus 81 outputs a flag to the timing at which the block/raster transformation apparatus 80 outputs a final raster. A 5×5 spacial filtering apparatus (filtering part) 83 filters picture data which are outputted as raster data by smooth filtering. An output switching apparatus (multiplexer: output switching part) 84 selectively outputs an output from the block/raster transformation apparatus 80 or an output from the spacial filtering apparatus 83 in accordance with a flag predicting a block distortion.

The block distortion prediction apparatus 81 and the timing adjusting apparatus 82 form switching control part which controls switching performed by the output switching apparatus 84.

<Operation>

In the picture compressing and expanding apparatus having such a structure as above, during data compression, the raster/block transformation apparatus 71 transforms picture data which are in the form of raster data into 8×8 block data. The 2D-DCT apparatus 72 transforms the transformed block data into a space/frequency space. The zigzag transformation apparatus 73 sorts the data which are transformed into a frequency space from low frequencies. Utilizing human visual characteristics, the quantization apparatus 74 finely quantizes low frequency data and roughly quantizes high frequency data, whereby electric power concentration of the data is intensified while suppressing a deterioration in the picture quality and therefore a compression rate is improved. The entropy coding apparatus 75 compresses the data by entropy coding such as Huffman coding.

On the other hand, during decoding, the entropy decoding apparatus 76 decodes the compressed data by entropy coding such as Huffman coding. After reversely quantized, of a signal outputted from the inverse quantization apparatus 77, lower spatial frequency components are outputted first and higher spatial frequency components are outputted later.

Figure 4:
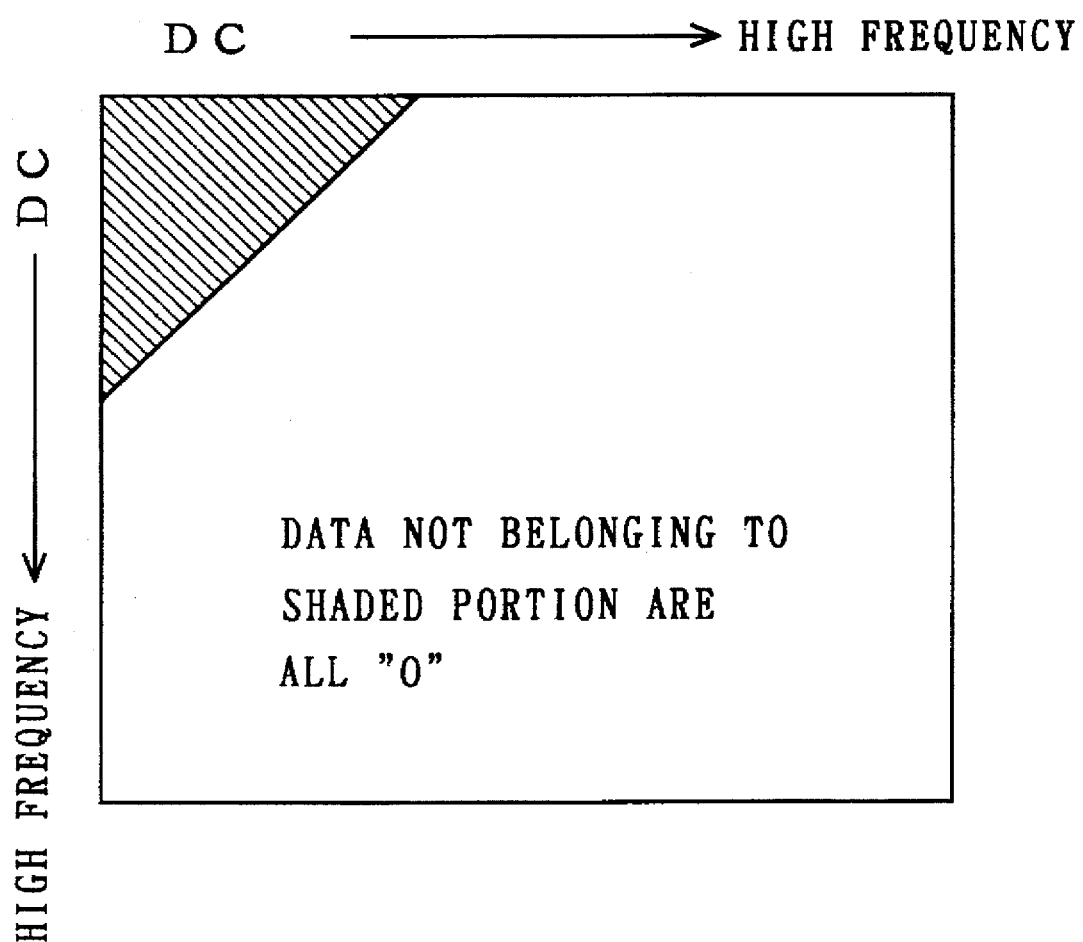
FIG. 4 is a view showing a data structure for judging an appearance of a block distortion in the picture compressing and expanding apparatus of the second preferred embodiment of the present invention.

With respect to components within a block decomposed into 64 frequency components, if the forth and the following frequency components from the lowest frequency component are all "0" as shown in FIG. 4, a flag is up. A flag is down if any of those components is not "0." A block distortion is conspicuous in a picture portion with a relatively moderate graduation such as a sky and a wall. As seen when decomposed into spacial frequencies, such a picture has data only in a low frequency region but almost no data in a high frequency region. In other words, by judging whether the forth and the following data are all "0" as described above, it is possible to identify a picture block which is likely to have a block distortion. As shown in FIG. 5, whether the forth and the following data outputted from the second NOR circuit 92 are all "0" is judged in accordance with the first timing signal TS3 in this case.

Next, in accordance with the flag supplied from the block distortion prediction apparatus 81, the output switching apparatus 84 switches and outputs the output signal from the spacial filtering apparatus 83 or the signal as it is supplied from the block/raster transformation apparatus 80. The timing of switching is adjusted to the timing at which the block distortion prediction apparatus 81 outputs decoded data. Through the processing above, only a portion which is likely to have a block distortion is filtered while data of the remaining portion are outputted without filtering. This prevents a picture having a complex pattern from getting blurred, thereby reducing a block distortion.

<<Third Preferred Embodiment>>

<Structure>

Figure 6:
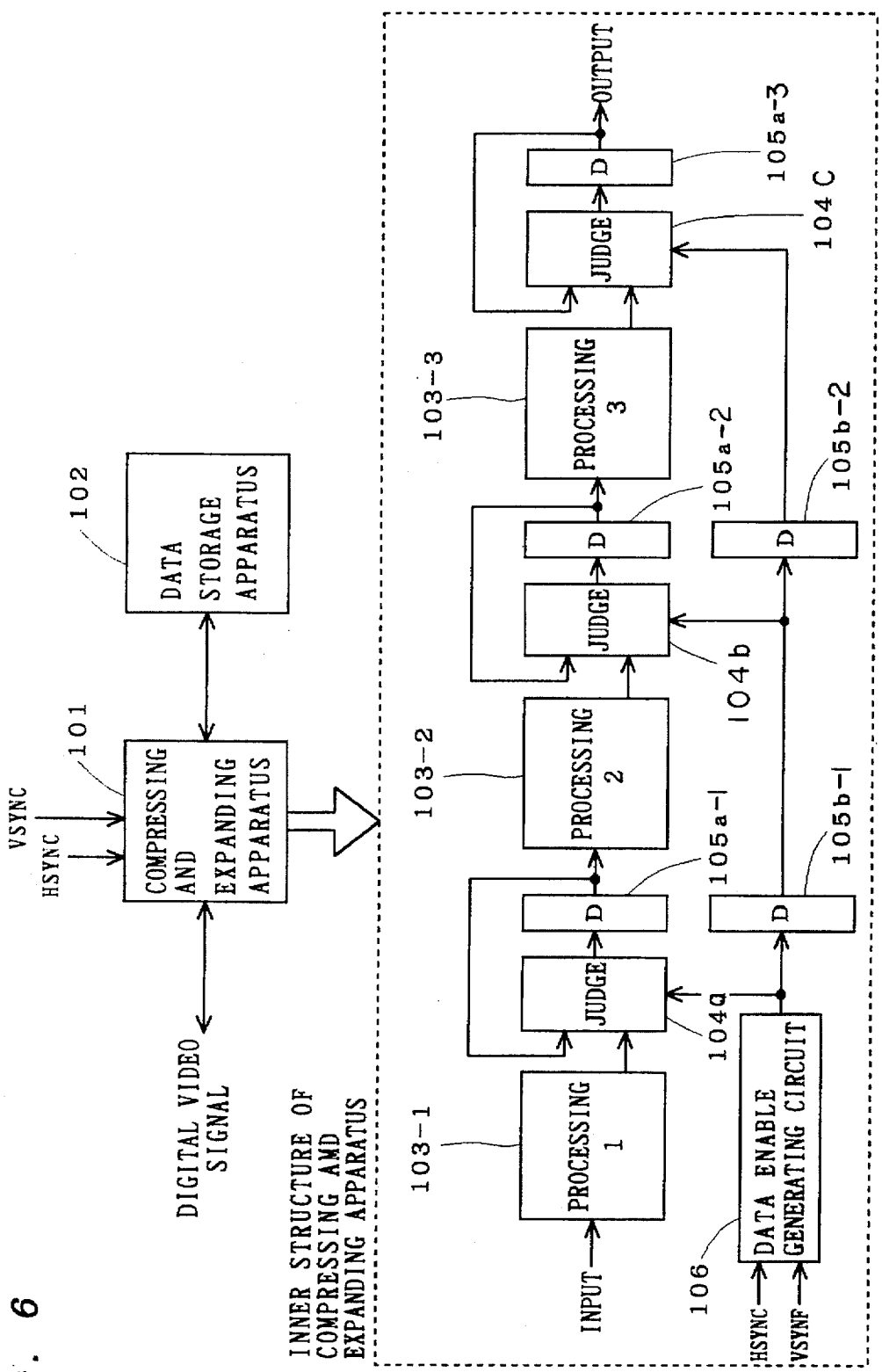
FIG. 6 is a view showing a picture compressing and expanding apparatus and a peripheral apparatus according to a third preferred embodiment of the present invention.
Figure 7:
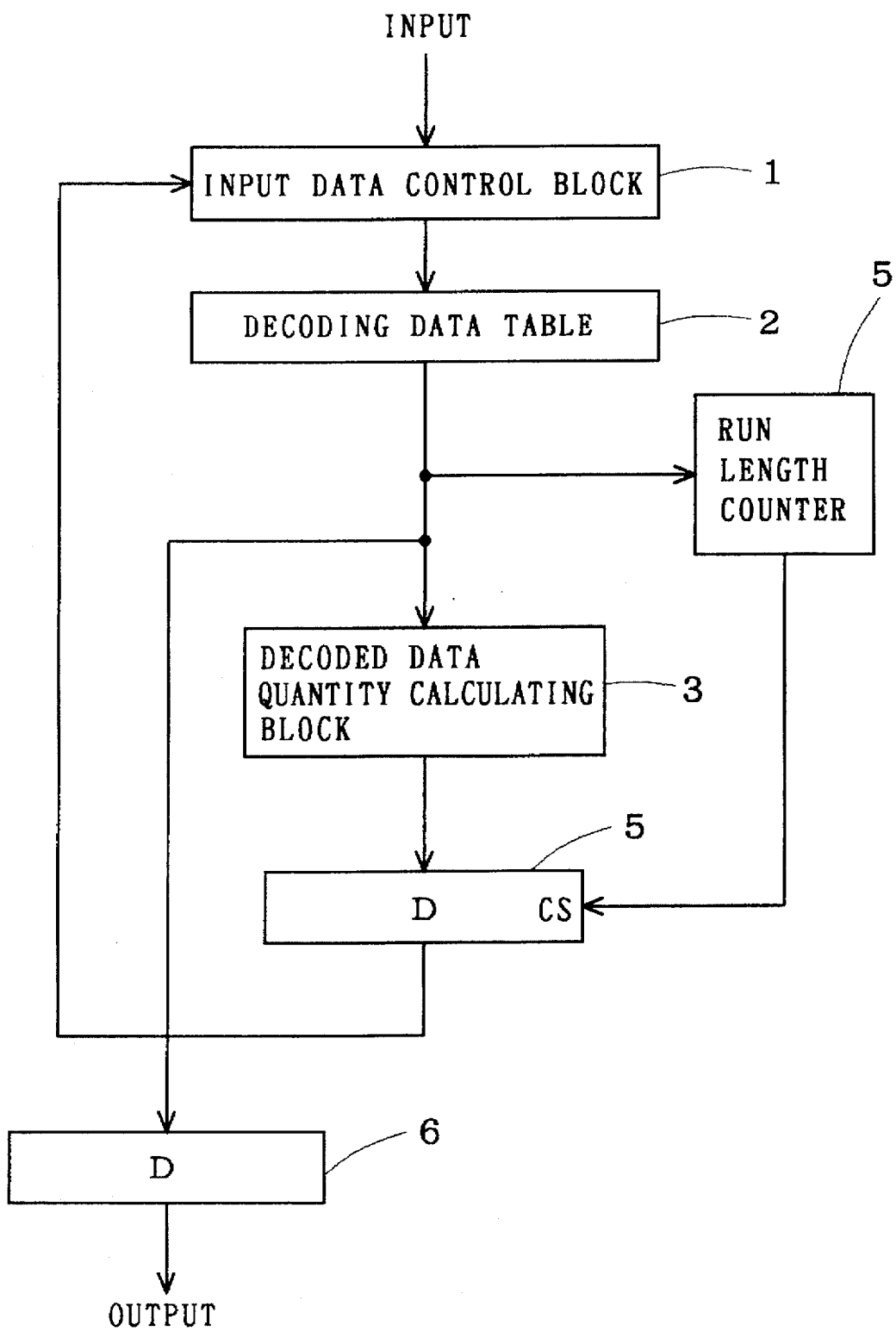
FIG. 7 is a view showing an example of a structure of a conventional high speed Huffman decoder.
Figure 8:
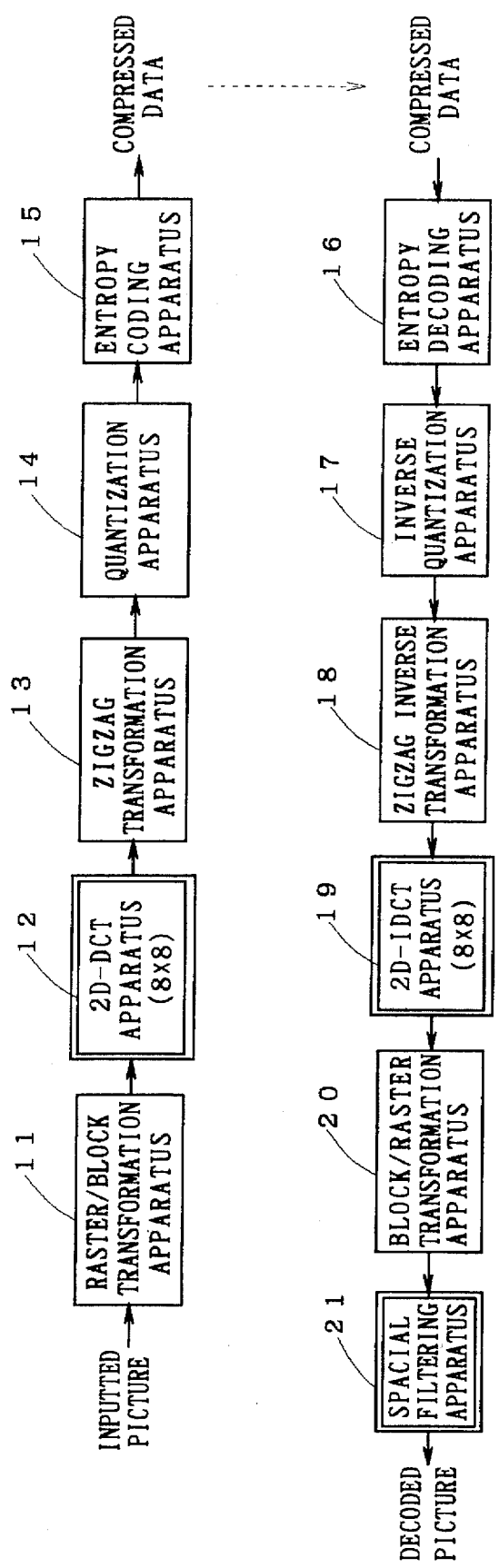
FIG. 8 is a view showing a compression/expansion flow in a conventional picture compressing and expanding apparatus using ADCT method.
Figure 9:
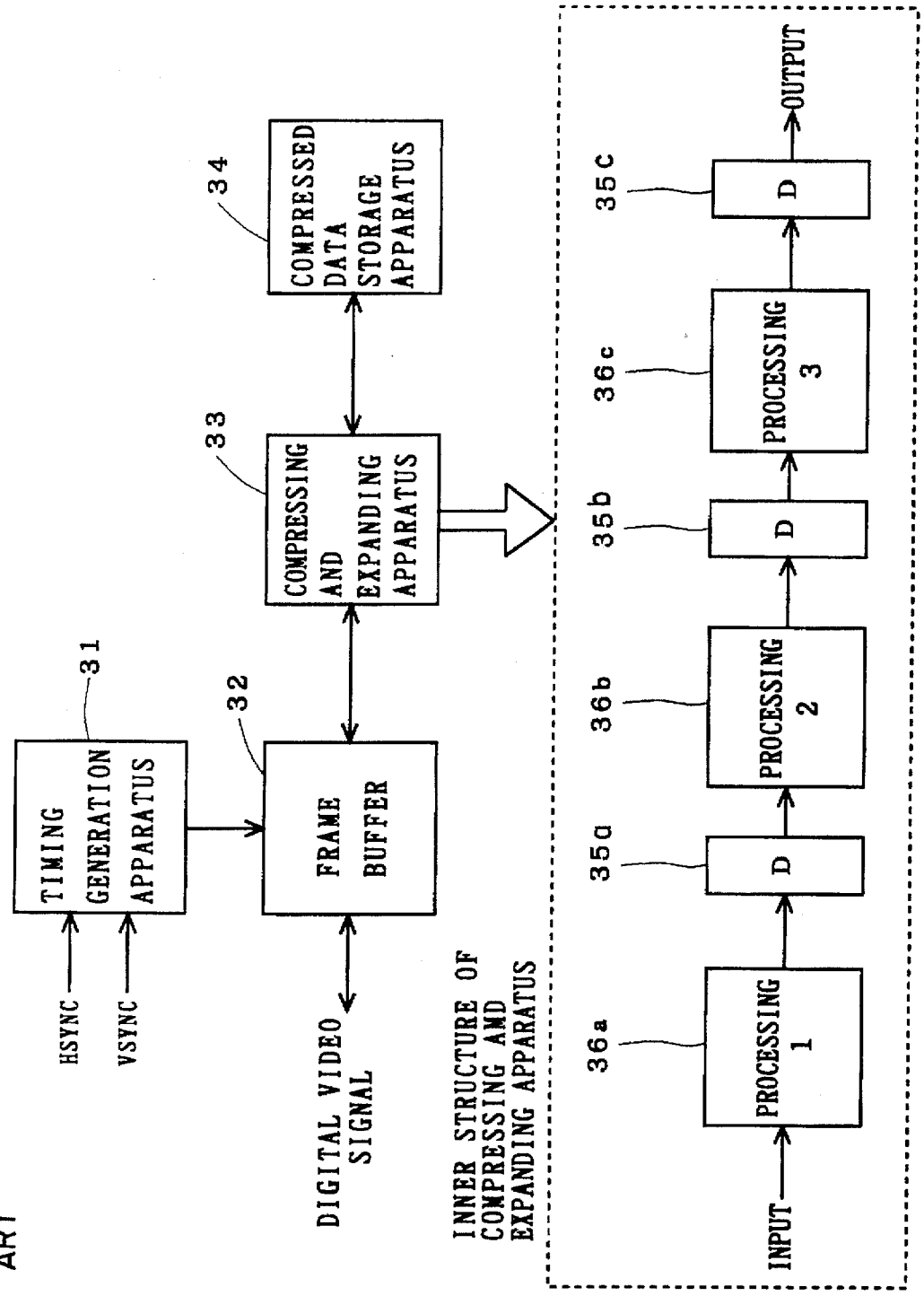
FIG. 9 is a view showing a first conventional picture compression and expansion apparatus.
Figure 10:
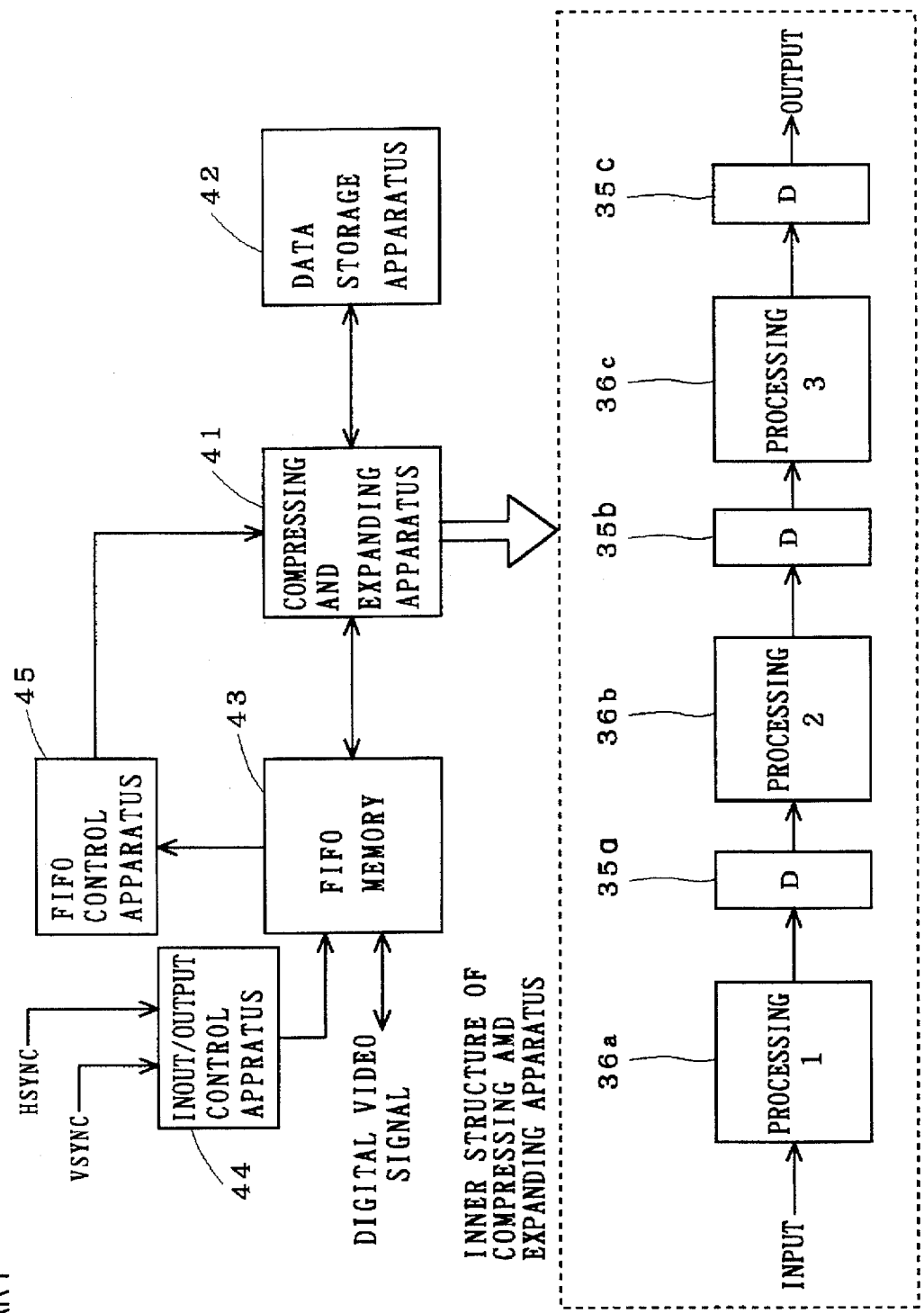
FIG. 10 is a view showing a second conventional picture compression and expansion apparatus.

FIG. 6 is a functional block diagram showing a picture compressing and expanding apparatus and a peripheral apparatus according to a third preferred embodiment of the present invention. In FIG. 6, denoted at 101 is a picture compressing and expanding apparatus which comprises a compression part and an expansion part, and denoted at 102 is a data storage apparatus for storing compressed data. Denoted at 103-1, 103-2 and 103-3 are various signal processing apparatuses disposed within the picture compressing and expanding apparatus 101. In accordance with a data enable signal received from a data enable generating circuit 106, internal judging apparatuses 104a, 104b, and 104c (processing control means) disposed within the picture compressing and expanding apparatus 101 determine whether to include data processed by the precedent signal processing apparatuses 103-1, 103-2 and 103-3 into outputs from pipelines. Internal delay apparatuses (registers) 105a-1, 105a-2 and 105a-3 disposed within the picture compressing and expanding apparatus 101 delay internal signals from the internal judging apparatuses 104a, 104b, and 104c each by one clock. Internal delay apparatuses (enable signal delaying means: registers) 105b-1 and 105b-2 disposed within the picture compressing and expanding apparatus 101 delay the data enable signal from the data enable generating circuit 106 by one clock in correspondence with the number of the signal processing apparatuses 103-1, 103-2 and 103-3 which are disposed for the respective pipelines. The data enable generating circuit (enabling means) 106 generates the data enable signal which enables the processing only during a period in which data are valid in accordance with the signal HSYNC and the signal VSYNC which are supplied from outside. The internal judging apparatuses 104a, 104b, and 104c permit signal processing within the pipelines only when the data enable signal is received from the data enable generating circuit 106 and stop signal processing within the pipelines when the data enable signal is not received. A regular multiplexer is used as the internal judging apparatuses 104a 104b, and 104c. Of two input terminals disposed as a pair of each signal processing apparatus, one is connected to an output terminal of each one of the signal processing apparatuses 103-1, 103-2 and 103-3 and the other is connected to an output terminal of subsequent internal delay apparatuses 105a-1, 105a-2, 105a-3 for providing a feedback.

<Operation>

A processing method adopted in the picture compressing and expanding apparatus above will be described. During compression, the data enable generating circuit 106 generates the data enable signal only during a period in which an inputted video signal is valid, in accordance with the signal HSYNC and the signal VSYNC. While the signal processing apparatuses 103-1, 103-2 and 103-3 serially process inputted picture data by pipelining, the subsequent internal judging apparatuses 104a 104b, and 104c determine whether to output the data to the next apparatus or hold the data. That is, data are processed only when the data are valid. When the data are not valid, internal delay apparatuses 105a-1, 105a-2, and 105a-3, holds the data until the next valid signal is received. Through this processing, only valid inputted picture signals are compressed. Now, an operation during expansion will be described.

During expansion, the timing at which a video signal is outputted is delayed from the start of the expanding processing by a period corresponding to the number of the pipelines. That is, when expanded data are to be outputted in synchronization with the signal HSYNC and the signal VSYNC, the data enable generating circuit 106 outputs the data enable signal in such a manner which starts expanding processing earlier than the timing at which valid data are outputted by a period corresponding to the number of the pipelines. Such processing is possible without any problem despite the existence of a few pipelines since a video signal includes a substantial quantity of invalid data in general.

<<Modification>>

Although the first preferred embodiment requires to decompose data for the decoder and for the memory depending on whether the run length is "0" or alternatively "1" or larger, other dividing method may be used considering a balance between a speed and a circuit size.

While the invention has been described in detail, the foregoing description is in all aspects illustrative and not restrictive. It is understood that numerous other modifications and variations can be devised without departing from the scope of the invention.

We claim:

1. A picture compressing and expanding apparatus comprising a compression part for compressing a picture signal and an expansion part for decoding and expanding data of variable length codes compressed by said compression part, wherein said expansion part comprises:

a small scale decoder for decoding one piece of compressed data;

a large scale decoder having a processing speed which is approximately half that of said small scale decoder and decodes two or more pieces of said compressed data;

input data control means for supplying said data of variable length codes compressed by said compression part to said small scale decoder and said large scale decoder at the same time;

first switching means for switching and outputting output data supplied from said small scale decoder and output data supplied from said large scale decoder;

delaying means for delaying output data supplied from said first switching means by a unit time;

second switching means for switching and outputting the output data supplied from said first switching means and output data supplied from said delaying means in accordance with a predetermined timing signal; and timing control means for generating said predetermined timing signal which causes said second switching means to switch from the output data supplied from said delaying means to the output data supplied from said first switching means, said small scale decoder comprises judging means for determining whether received data are one piece of data or two or more pieces of data, and said timing means comprises:

irregular timing detecting means for detecting irregular data which are created when said first switching means switches the output data supplied from said small scale decoder and the output data supplied from said large scale decoder in accordance with a judgement signal which is yielded by said judging means for said small scale decoder; and timing signal output means for said predetermined timing signal to said second switching means in accordance with a signal received from said timing control means.

2. A picture compressing and expanding apparatus, comprising:

a compression part for transforming a picture signal by orthogonal transformation to thereby non-reversibly compress said picture signal;

an expansion part for decoding and expanding the data which are compressed by said compression part and for outputting the data;

a filter part for filtering at least a portion of the data which are outputted from said expansion part by a predetermined smooth filtering and for outputting the data;

an output switching part for switching the data outputted from said expansion part and data outputted from said filter part; and a switching control part for controlling switching performed by said output switching part, wherein said output switching part comprises:

block distortion predicting means for predicting a block distortion of the data outputted from said expansion part using a threshold which is determined in accordance with a data structure of a predetermined frequency space which is stored within said expansion part; and timing signal generating means for generating said predetermined timing signal which causes said output switching part to switch from the data outputted from said expansion part to the data outputted from said filter part in accordance with a prediction result yielded by said block distortion predicting means only when a block distortion is predicted.

3. The picture compressing and expanding apparatus of claim 2, wherein said block distortion predicting means of said switching control part comprises judging means for determining whether components not belonging to a predetermined low frequency region of data transformed into the frequency space through predetermined two-dimensional transformation are all "0."

4. A picture compressing and expanding apparatus comprising a compression part for compressing a picture signal and an expansion part for decoding and expanding data of variable length codes compressed by said compression part so that said picture signal is processed through predetermined processing in pipelines in at least one of said compression part and said expansion part, said picture compressing and expanding apparatus being characterized in comprising:

enable means for detecting timing at which pipelines validly operate in accordance with a horizontal synchronizing signal and a vertical synchronizing signal which are inputted to said enable means and for thereafter outputting a predetermined enable signal; and processing control means for permitting signal processing within said pipelines only when said predetermined enable signal is received from said enable means and for stopping signal processing within said pipelines when said predetermined enable signal is not received.

5. A picture compressing and expanding apparatus comprising a compression part for compressing a picture signal and an expansion part for decoding and expanding data of variable length codes compressed by said compression part so that said picture signal is processed through predetermined processing in pipelines in at least one of said compression part and said expansion part, said picture compressing and expanding apparatus being characterized in comprising:

enable means for detecting timing at which pipelines validly operate in accordance with a horizontal synchronizing signal and a vertical synchronizing signal which are inputted to said enable means and for thereafter outputting a predetermined enable signal;

enable signal delaying means for delaying said predetermined enable signal by the number of said pipelines which perform signal processing; and processing control means for permitting signal processing within each one of said pipelines only when said predetermined enable signal corresponding to each one of said pipelines is received from said enable means or said enable signal delaying means and for stopping signal processing within said pipelines when said predetermined enable signal is not received.

* * * * *